(12) United States Patent
Takinami et al.

(10) Patent No.: US 8,095,093 B2
(45) Date of Patent: Jan. 10, 2012

(54) MULTI-MODE TRANSMITTER HAVING ADAPTIVE OPERATING MODE CONTROL

(75) Inventors: Koji Takinami, Saratoga, CA (US); Paul Cheng-Po Liang, Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 718 days.

(21) Appl. No.: 12/203,361

(22) Filed: Sep. 3, 2008

(65) Prior Publication Data

US 2010/0056068 A1    Mar. 4, 2010

(51) Int. Cl.
*H01Q 11/12* (2006.01)
*H04B 1/04* (2006.01)
(52) U.S. Cl. .................. 455/127.1; 455/127.4; 455/522
(58) Field of Classification Search .............. 455/69, 455/127.1–127.5, 522
See application file for complete search history.

(56) References Cited

U.S. PATENT DOCUMENTS

| | | | |
|---|---|---|---|
| 6,987,417 B2 | 1/2006 | Winter et al. | |
| 7,043,213 B2 | 5/2006 | Robinson et al. | |
| 7,493,093 B2 * | 2/2009 | Boerman et al. | 455/126 |
| 7,532,680 B2 * | 5/2009 | Vayrynen et al. | 375/295 |
| 7,860,467 B2 * | 12/2010 | Pan | 455/127.1 |
| 2004/0185807 A1 * | 9/2004 | Ramachandran | 455/127.1 |
| 2006/0084469 A1 * | 4/2006 | Malone et al. | 455/552.1 |
| 2006/0285481 A1 * | 12/2006 | Lane et al. | 370/208 |
| 2007/0014382 A1 | 1/2007 | Shakeshaft et al. | |
| 2007/0032208 A1 * | 2/2007 | Choi et al. | 455/114.3 |
| 2008/0194216 A1 * | 8/2008 | Rofougaran | 455/127.5 |
| 2009/0004981 A1 * | 1/2009 | Eliezer et al. | 455/127.1 |
| 2009/0054008 A1 * | 2/2009 | Satou | 455/78 |
| 2010/0009642 A1 * | 1/2010 | Pratt et al. | 455/127.1 |

OTHER PUBLICATIONS

Paul Cheng-Po Liang et al., U.S. Appl. No. 12/008,132, A Multiple-Mode Modulator to Process Baseband Signals, filed Jan. 8, 2008.

* cited by examiner

*Primary Examiner* — Simon Nguyen (57) ABSTRACT

Methods and apparatus for transmitting communications signals that are both power efficient and effective at avoiding or reducing transmitter-generated receive band noise. An exemplary transceiver apparatus includes a multi-mode transmitter that is configurable to operate in a plurality of operating modes (e.g., a polar mode, a quadrature mode and a hybrid mode), a receiver, and an operating mode controller. The operating mode controller is configured to control which operating mode the transmitter is to operate, depending on one or more of a transmit (Tx) power, receive (Rx) power, the Tx power relative to the Rx power, a level of frequency separation between a Tx frequency band and a Rx frequency band (Tx/Rx band separation), and modulation type employed by the transmitter.

11 Claims, 9 Drawing Sheets

PA characteristic

Large
Tx/Rx separation (> 190 MHz)

FIGURE 9B

Medium
Tx/Rx separation (80/95 MHz)

FIGURE 9C

Small
Tx/Rx separation (45 MHz)

| Operating Band | Uplink Frequencies (Tx) | Downlink Frequencies (Rx) |
|---|---|---|
| I | 1920 – 1980 MHz | 2110 –2170 MHz |
| II | 1850 –1910 MHz | 1930 –1990 MHz |
| III | 1710-1785 MHz | 1805-1880 MHz |
| IV | 1710-1755 MHz | 2110-2155 MHz |
| V | 824 – 849 MHz | 869-894 MHz |
| VI | 830-840 MHz | 875-885 MHz |

FIGURE 10A (Prior Art)

| Operating Band | TX-RX frequency separation |
|---|---|
| I | 190 MHz |
| II | 80 MHz |
| III | 95 MHz |
| IV | 400 MHz |
| V | 45 MHz |
| VI | 45 MHz |

FIGURE 10B (Prior Art)

MULTI-MODE TRANSMITTER HAVING ADAPTIVE OPERATING MODE CONTROL

FIELD OF THE INVENTION

The present invention relates to communications transmitters. More specifically, the present invention relates to methods and apparatus for transmitting communications signals that are both power efficient and effective at avoiding or reducing transmitter-generated receive band noise.

BACKGROUND OF THE INVENTION

Wireless communications devices include two essential components—a transmitter and a receiver. In mobile wireless communications devices, such as cellular handsets, the transmitter and receiver are combined into a single unit and share a common antenna. When combined in this manner, the transmitter and receiver are collectively referred to as a "transceiver."

Transceivers are generally categorized as being either "half-duplex" or "full-duplex". In a half-duplex transceiver, only one of the transmitter and receiver is permitted to operate at any give time. In a full-duplex transceiver the transmitter and receiver operate simultaneously. To avoid interference between transmitted and received signals in full-duplex operation, the transmitter and receiver are designed to transmit and receive in different and ideally non-overlapping frequency bands. Whether half-duplex or full-duplex operation is used is usually determined by the wireless technology involved. For example, second generation (2G) cellular technologies such as Global System for Mobile communications (GSM) and Enhanced Data rates for GSM Evolution (EDGE) employ half-duplex operation, while third generation (3G) cellular technology based on the Wideband Code Division Multiple Access (W-CDMA) standard employs full-duplex operation.

Figure 1:
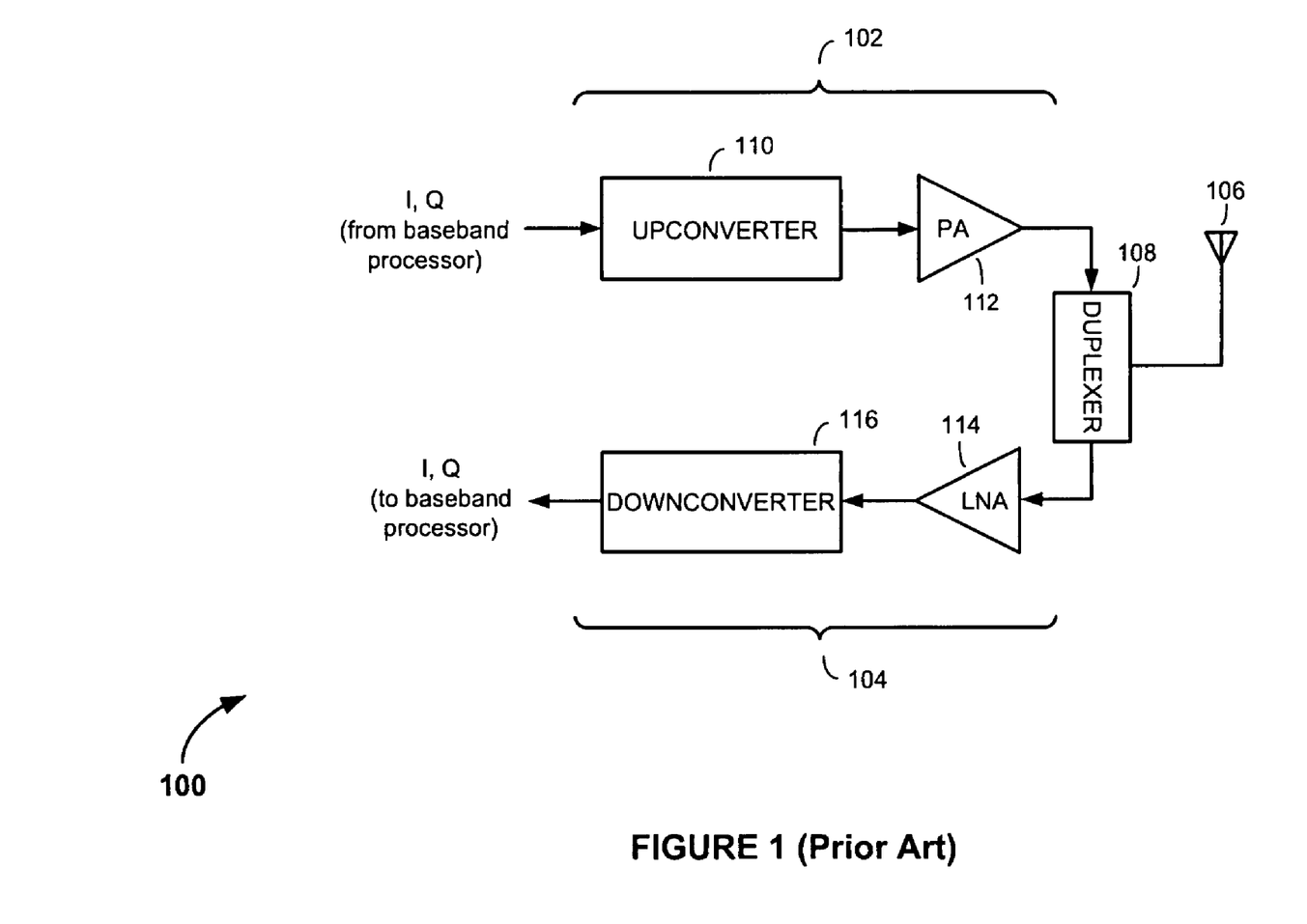
FIG. 1 is a simplified drawing of a conventional full-duplex transceiver.

FIG. 1 is a simplified drawing of a full-duplex transceiver 100. The full-duplex transceiver 100 includes a transmitter 102, a receiver 104, an antenna 106, and a duplexer 108 that couples the transmitter 102 and receiver 104 to the antenna 106. The transmitter 102 includes an upconverter 110 and a power amplifier (PA) 112, which operate to upconvert and amplify in-phase (I) and quadrature phase (Q) baseband signals to radio frequency (RF) signals centered in a transmit (Tx) band. The Tx signals are passed through the duplexer 108 and fed to the antenna 106, which radiates the Tx signals over the air to a remote receiver. The receiver 104 includes a low-noise amplifier (LNA) 114 and a downconverter 116. The LNA 114 amplifies receive (Rx) signals received in a Rx band, and the downconverter 116 downconverts the amplified Rx signals from RF to baseband. The duplexer 108 provides a filtering and isolation function, which ideally prevents Tx signals from the transmitter 102 from leaking into and saturating the front-end of the receiver 104.

One of the most difficult challenges in the design of the full-duplex transceiver 100 involves the design of the transmitter 102. Not only should the transmitter 102 be power efficient in order to conserve battery life, it should also transmit only within a designated Tx band in order to avoid desensitizing the receiver 104. Unfortunately, a transmitter having both of these desirable attributes is difficult to design.

Figure 2:
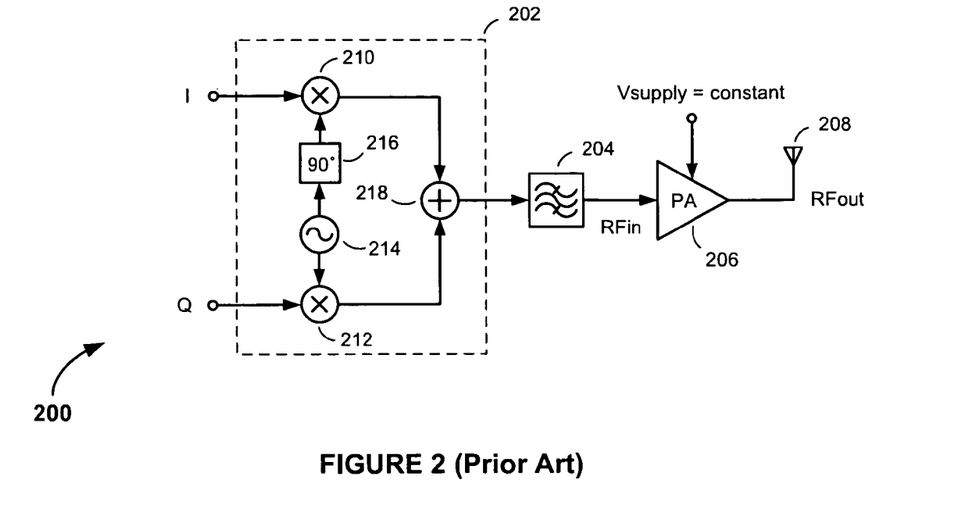
FIG. 2 is a block diagram of a conventional quadrature-modulator-based transmitter.

Conventional transmitter architectures are based on what is known as a quadrature modulator. FIG. 2 is a block diagram of quadrature-modulator-based transmitter 200. The quadrature-modulator-based transmitter 200 comprises a quadrature modulator 202 including an I-channel mixer 210, Q-channel mixer 212, local oscillator (LO) 214, 90° phase shifter 216, and summer 218; a surface acoustic wave filter (SAW) 204; a power amplifier (PA) 206; and an antenna 208.

The quadrature modulator 202 operates to upconvert information to be transmitted and contained in I and Q baseband signals to RF by modulating the information onto orthogonal RF carrier signals generated by the LO 214 and the 90° phase shifter 216. The summer 218 combines the upconverted signals and couples the summed result to an input of the SAW filter 204, which operates as a bandpass filter. Finally, the bandpass-filtered signal from the SAW filter 204 is amplified by the PA 206 and radiated over the air by the antenna 208 to a remote access point or cellular base station.

One desirable characteristic of the quadrature-modulator-based transmitter 200 is that the frequency and phase of the RF carrier signal can be modulated simply by manipulating the amplitudes of the I and Q baseband signals. However, a drawback is that it is not very power efficient. In an effort to increase spectral efficiency, many state-of-the-art communications systems employ nonconstant-envelope signals. To prevent clipping of the signal peaks of these nonconstant-envelope signals in the quadrature-modulator-based transmitter 200, the signal levels must be reduced before being introduced to the input of the PA 206, and the PA 206 must be configured to operate in its linear region of operation. Unfortunately, linear PAs configured to operate at reduced drive levels are not very power efficient. This lack of power efficiency is a major concern, particularly in battery-powered applications.

The linearity versus efficiency trade-off of the quadrature-modulator-based transmitter 200 can be avoided by using an alternative type of transmitter known as a polar modulation transmitter. As explained below, a polar modulation transmitter temporarily removes the amplitude information from nonconstant-envelope signals so that the polar modulation transmitter's PA can be configured to operate in its nonlinear region, where it is much more efficient at converting power from the transmitter's power supply into RF power.

Figure 3:
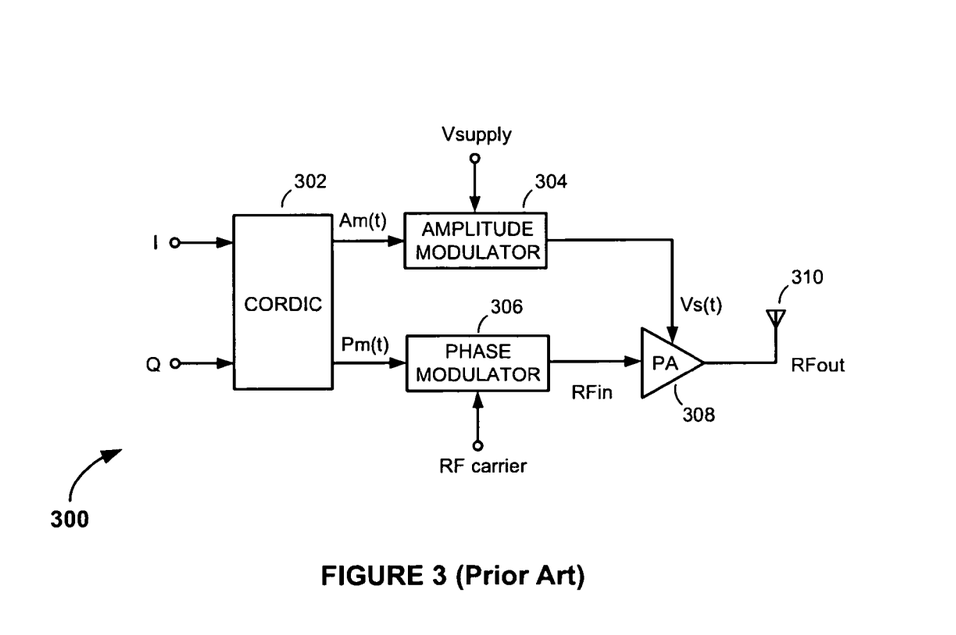
FIG. 3 is a simplified drawing of a conventional polar modulation transmitter.

FIG. 3 is a simplified drawing of a polar modulation transmitter 300. The polar modulation transmitter 300 comprises a rectangular-to-polar converter (or Coordinate Rotation Digital Computer (CORDIC)) converter 302; an amplitude modulator 304 configured in an amplitude path; a phase modulator 306 configured in a phase path; a PA 308; and an antenna 310.

The CORDIC converter 302 operates to convert rectangular-coordinate I and Q baseband signals into polar-coordinate amplitude and phase component signals $Am(t)$ and $Pm(t)$, according to the mapping functions: $Am(t)=\sqrt{I(t)^2+Q(t)^2}$ and $Pm(t)=\tan^{-1}[Q(t)/I(t)]$. The amplitude modulator 304 modulates a direct current (DC) power supply Vsupply (e.g., as supplied from the communication device's battery) according to amplitude variations represented in the amplitude component signal $Am(t)$. The resulting amplitude modulated power supply signal $Vs(t)$ is coupled to the power supply port of the PA 308. Meanwhile, the phase modulator 306 operates to modulate an RF carrier signal with phase information represented in the phase component signal $Pm(t)$. Because the resulting phase-modulated RF carrier signal RFin has a constant envelope, the PA 308 can be configured to operate in its nonlinear region of operation, where it is efficient at converting power from the DC power supply Vsupply to RF power. Typically, the PA 308 is implemented as a Class D, E or F switch-mode PA 308 operating in compression, so that the output power of the PA 308 is directly controlled by the amplitude modulated power supply signal $Vs(t)$ applied to the power supply port of the PA 308. Effectively, the PA 308 operates as a multiplier, amplifying the constant-envelope phase-modulated RF carrier signal according to amplitude variations in the amplitude modulated power supply signal Vs(t) to produce the desired amplitude- and phase-modulated RF carrier signal RFout.

Although the polar modulation transmitter 300 is more power efficient than the quadrature-modulator-based transmitter 200, it has a number of drawbacks of its own. On problem relates to the fact that the bandwidths of the amplitude and phase component signals Am(t) and Pm(t) are typically wider than the bandwidths of the rectangular-coordinate I and Q signals. This so-called "bandwidth expansion" occurs due to the fact that the mapping functions: $Am(t) = \sqrt{I(t)^2 + Q(t)^2}$ and $Pm(t) = \tan^{-1}[Q(t)/I(t)]$ involve a nonlinear process that tends to spread the power spectra of the resulting modulation signals over a frequency range beyond the boundaries of the desired Tx band.

The level of bandwidth expansion that occurs depends in large part on the modulation format used. As mentioned above, many existing technologies such as orthogonal frequency division multiplexing (OFDM), and other existing or soon-to-be deployed cellular technologies, such as W-CDMA, High-Speed Packet Access (HSPA) and Long Term Evolution (LTE) technologies, employ nonconstant-envelope modulation formats, which produce signal trajectories passing through (or very close to) the origin. As the signal traverses through or near the origin, the magnitude of the amplitude component signal Am(t) rapidly decreases and then increases, while the phase of the phase component signal Pm(t) experiences a rapid phase jump of + or −180°.

A high level of bandwidth expansion results in a phase component single signal Pm(t) having a bandwidth that is difficult to translate to RF since the phase modulator 306 is usually capable of providing a linear response only over a narrowly-defined frequency range. Bandwidth expansion in the amplitude component signal Am(t) can also be problematic. To maximize efficiency, the amplitude modulator 304 is typically implemented as a switch-mode power supply. However, when the bandwidth of the amplitude component signal Am(t) is wider than the switching capabilities of the switch-mode power supply's switching transistors, the switch-mode converter is unable to accurately track the envelope of the amplitude component signal Am(t) and out-of-band signal energy is generated.

Figure 4:
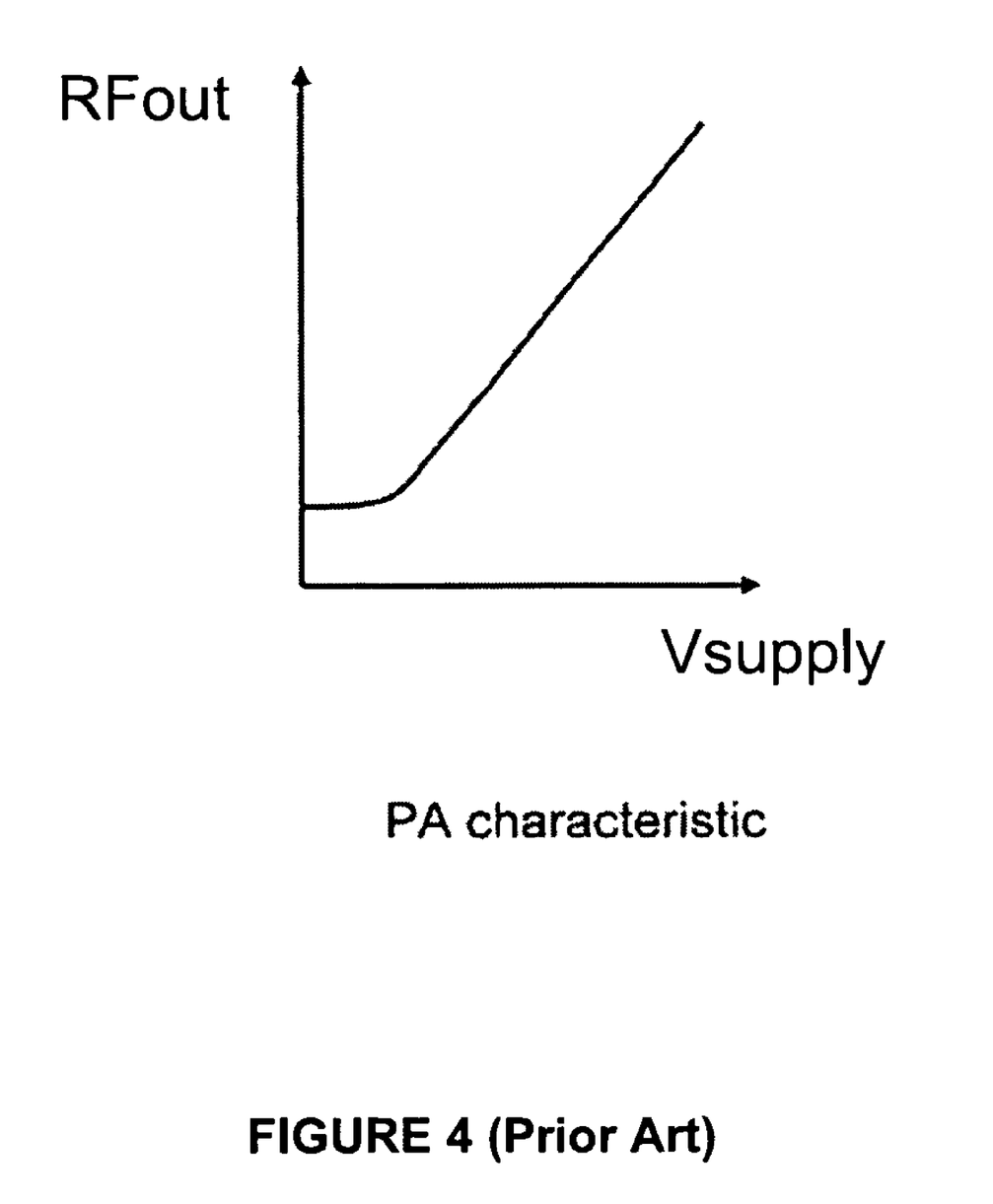
FIG. 4 is a graph of the modulated radio frequency (RF) output signal RFout of the power amplifier (PA) of the polar modulation transmitter in FIG. 3 as a function of the amplitude modulated power supply signal Vs(t) applied to the power supply port of the PA.

Another problem with the polar modulation transmitter 300 relates to the difficulty the PA 308 has in generating low output powers without also producing significant amounts of out-of-band distortion. Some wireless communications standards require that the transmitter of a communications device be capable of controlling its output power over a wide dynamic range. For example, the W-CDMA standard requires a transmitter of a cellular handset to be capable of controlling its average output power over a 70 dB range, including a lower limit of around −50 dBm. Unfortunately, this range of power control, particularly at low average output powers, is difficult to achieve in the polar modulation transmitter 300. In the polar modulation transmitter 300, average RF output power is controlled by the PA 308 in response to the magnitude of the amplitude modulated power supply signal Vs(t) supplied to the power supply port of the PA 308. When the magnitude of the modulated power supply signal Vs(t) is high and the PA 308 is operating in compression, the average RF output power of the PA 308 is proportional to the square of the amplitude modulated power supply signal Vs(t), and the amplitude- and phase-modulated RF carrier signal RFout responds fairly linearly to changes in the amplitude modulated power supply signal Vs(t). However, as illustrated in FIG. 4, when the magnitude of the modulated power supply signal Vs(t) is lowered to achieve lower RF output powers, these relationships no longer hold and the PA 308 responds in a highly nonlinear fashion. The nonlinear response of the PA 308 at low output powers can lead to significant out-of band distortion, beyond that due to the effects of bandwidth expansion alone.

Figure 5:
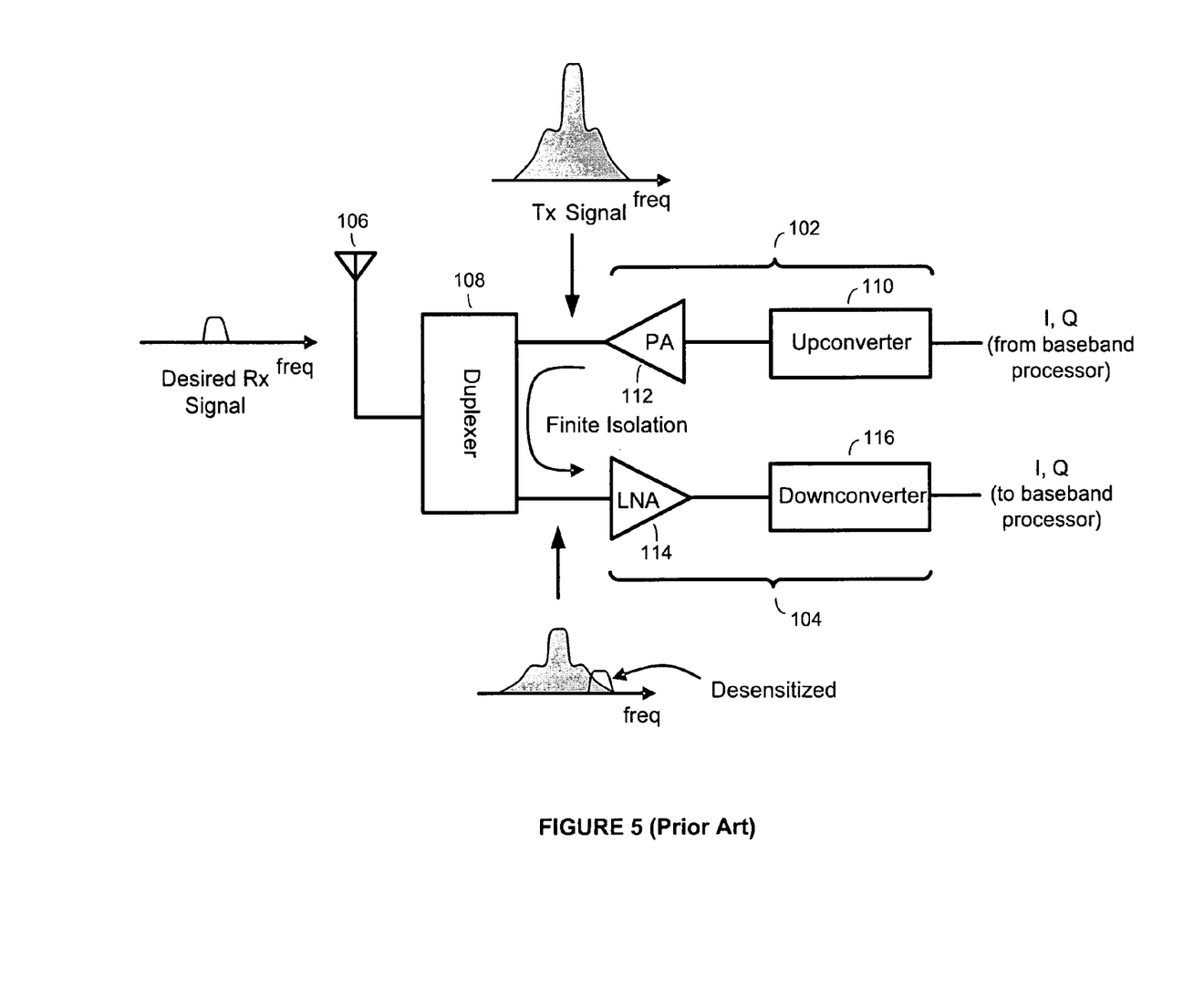
FIG. 5 is a drawing of the conventional full-duplex transceiver in FIG. 1, highlighting how out-of-band transmit (Tx) signal energy can undesirably leak through the transceiver's duplexer and into the front-end of the receiver when the Tx band and receive (Rx) band of the transceiver overlap.

When the polar modulation transmitter 300 is used to implement the transmitter 102 of the full-duplex transceiver 100, the out-of-band Tx signal energy generated from the effects of bandwidth expansion and the nonlinear characteristics of the PA 308 at low output powers can hinder the performance of the receiver 104. As illustrated in FIG. 5, due to finite Tx-Rx isolation provided by the duplexer 108, the out-of-band Tx signal energy leaks through the duplexer 108 and into the front-end of the receiver 104, where it appears as receive band noise. Receive band noise is of particular concern when the magnitude of the leaked signal energy is large compared to the magnitude of the desired Rx signals. It is also highly undesirable, since it desensitizes the receiver 104 and makes it difficult, or in some cases even impossible, to comply with out-of-band noise limitation standards.

SUMMARY OF THE INVENTION

Methods and apparatus for transmitting communications signals that are both power efficient and effective at avoiding or reducing transmitter-generated receive band noise are disclosed. An exemplary transceiver apparatus includes a multi-mode transmitter that is configurable to operate in a plurality of operating modes (e.g., a polar mode, a quadrature mode and a hybrid mode), a receiver, and an operating mode controller. The operating mode controller is configured to control which operating mode the transmitter is to operate, depending on one or more of a transmit (Tx) power, receive (Rx) power, the Tx power relative to the Rx power, a level of frequency separation between a Tx frequency band and a Rx frequency band (Tx/Rx band separation), and modulation type employed by the transmitter.

Use of the multi-mode transmitter in a full-duplex transceiver architecture allows the power efficiency and noise performance of the transceiver to be tailored to satisfy a particular application or to be adjusted so that the multi-mode transmitter complies with applicable wireless communications standards. For example, for widely spaced Tx and Rx bands, where transmitter-generated receive band noise is not of significant concern, the operating mode controller can be configured to enhance power efficiency by operating the multi-mode transmitter in polar mode. In situation where Rx band noise is more of a concern, e.g., due to closely spaced Tx and Rx bands, the operating mode controller can be configured so that the multi-mode transmitter operates in quadrature mode where the transmitter is less likely to generate receive band noise than it is when configured for operation in polar mode. Operating the multi-mode transmitter in quadrature mode and the availability of the other operating modes avoids having to subject the transmitter's power amplifier to signals that vary over a wide dynamic range. Availability of the hybrid mode also provides the ability to control the dynamic range of signals applied to the power amplifier, and further provides the ability to enhance the power efficiency of the multi-mode transmitter while maintaining transmitter-generated receive band noise to acceptable levels.

Further features and advantages of the present invention, including a description of the structure and operation of the above-summarized and other exemplary embodiments of the invention, are described in detail below with respect to accompanying drawings, in which like reference numbers are used to indicate identical or functionally similar elements.

DETAILED DESCRIPTION

Figure 6:
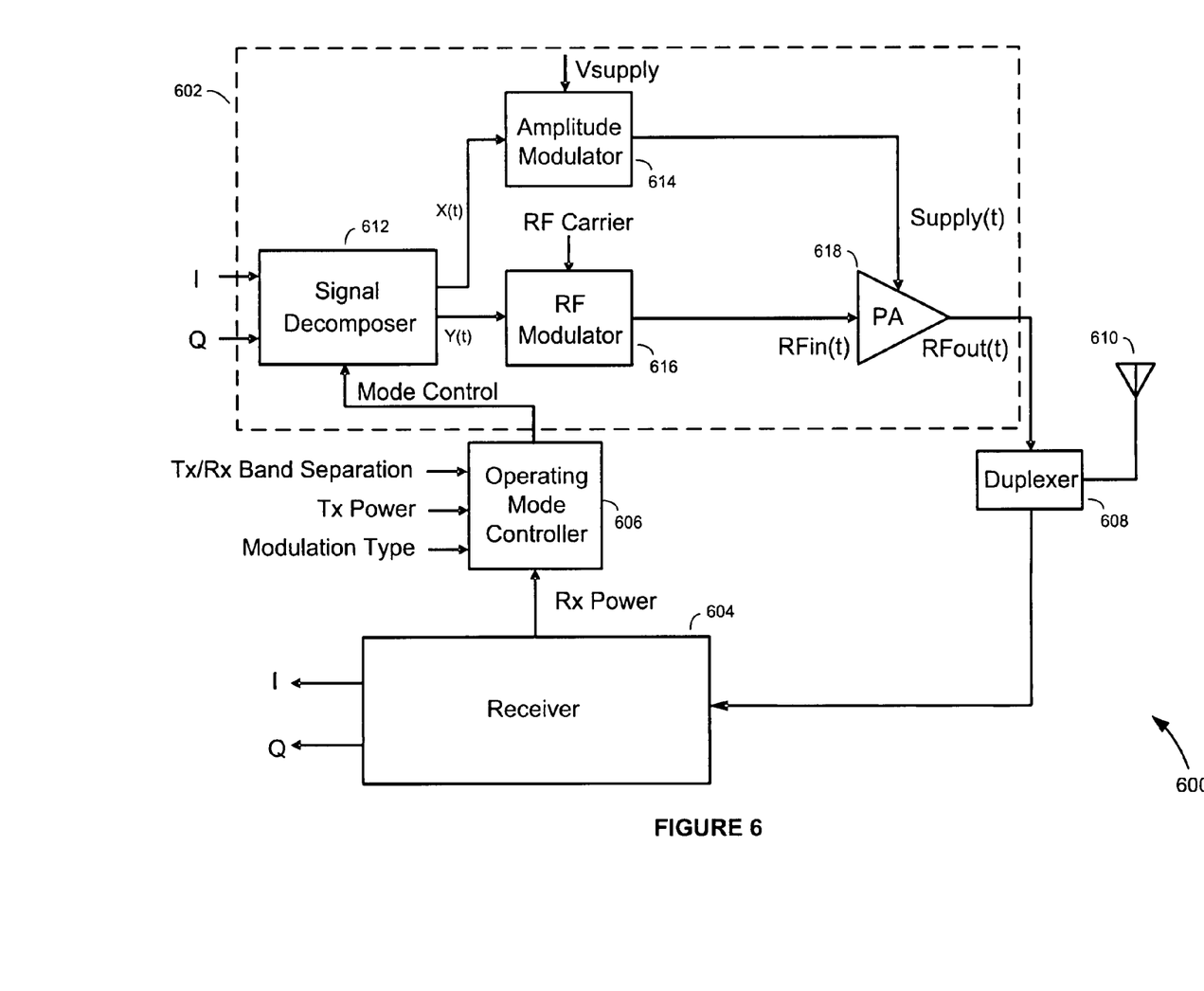
FIG. 6 is a drawing of transceiver having a multi-mode transmitter, according to an embodiment of the present invention.

Referring to FIG. 6, there is shown a transceiver apparatus 600, according to an embodiment of the present invention. The transceiver apparatus 600 comprises a multi-mode transmitter 602, a receiver 604, an operating mode controller 606, a duplexer 608, and an antenna 610.

The multi-mode transmitter 602 includes a signal decomposer 612, an amplitude modulator 614 configured within a first modulation path, a radio frequency (RF) modulator 616 configured within a second modulation path, and a power amplifier (PA) 618. The amplitude modulator 614 operates to modulate a direct current (DC) power supply signal Vsupply according to amplitude information represented in a first modulation signal X(t) generated and provided by the signal decomposer 612. The resulting amplitude modulated power supply signal Supply(t) is coupled to the power supply input of the PA 618. Meanwhile, the RF modulator 616 operates to modulate an RF carrier signal according to angle (i.e., frequency or phase) information (and also amplitude information, depending on the operating mode (explained below)) represented in a second modulation signal Y(t), which is also generated and provided by the signal decomposer 612. The resulting modulated RF carrier signal RFin(t) is coupled to the RF input of the PA 618.

The signal decomposer 612 operates to convert in-phase (I) and quadrature-phase (Q) baseband signals to polar-coordinate amplitude and phase component signals $Am(t)=\sqrt{I^2+Q^2}$ and $Pm(t)=\tan^{-1}(Q/I)$, and then decompose the amplitude and phase component signals Am(t) and Pm(t) into first and second modulation signals X(t) and Y(t), either or both of which has a lower signal bandwidth than the polar-coordinate amplitude and phase component signals Am(t) and Pm(t).

Figure 7:
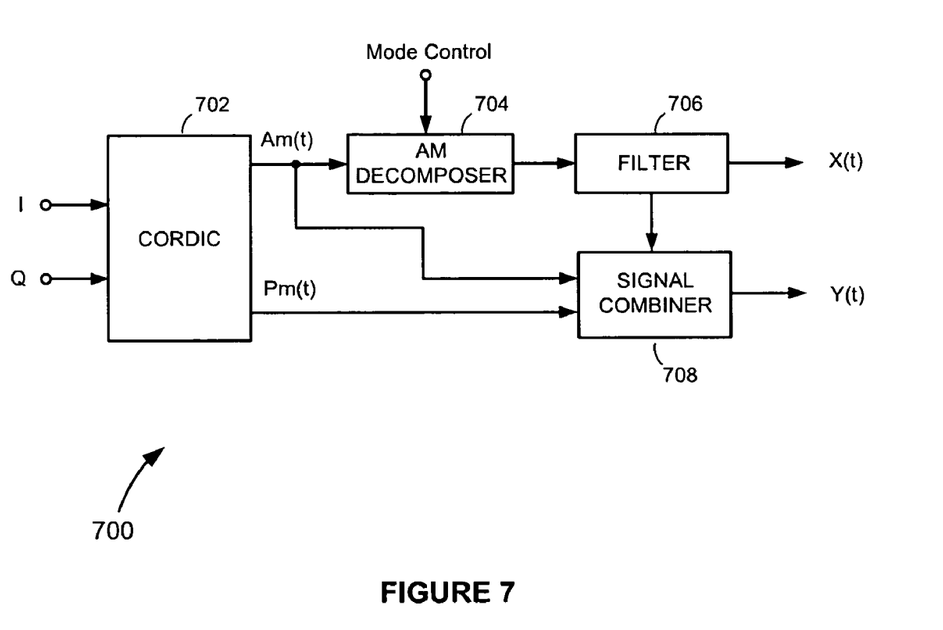
FIG. 7 is a drawing of an exemplary signal decomposer, which can be used in the multi-mode transmitter of the transceiver in FIG. 6, according to an embodiment of the present invention.

The signal decomposer 612 can be implemented in various ways. FIG. 7 is a drawing of one approach that may be used. The signal decomposer 700 comprises a Coordinate Rotation Digital Computer (CORDIC) converter 702, an amplitude modulation (AM) decomposer 704, a filter 706, and a signal combiner 708. The CORDIC converter 702 operates to convert the I and Q baseband signals to the polar-coordinate amplitude and phase component signals Am(t) and Pm(t). The AM decomposer 704 monitors a mode control command generated and provided by the operating mode controller 606, and, in response, generates the first modulation signal X(t), which may be first optionally filtered by the filter 706, as shown in the drawing, to further reduce signal bandwidth. The second modulation signal Y(t) can also (or alternatively) be filtered to further reduce its bandwidth, as will be appreciated by those of ordinary skill in the art. The signal combiner 708 uses the amplitude information represented in the original amplitude component signal Am(t) and amplitude information in the signal at the output of AM decomposer 704 (or output of the filter 706, if it is used) to derive what the amplitude of the second modulation signal Y(t) needs to be, and then combines the amplitude information with the phase modulation information represented in the phase component signal Pm(t) to form the second digital modulation signal Y(t).

According to one embodiment of the invention, the multi-mode transmitter 602 is configurable to operate in one of three different modes: a quadrature mode, a polar mode and a hybrid mode. Which of the three different operating modes the multi-mode transmitter 602 is configured to transmit is determined by the mode control command generated and provided by the operating mode controller 606. The operating mode controller 606 is configured to generate and provide the mode control command based on one or more of the following: level of transmit (Tx) band to receive (Rx) band separation (Tx/Rx band separation), Rx signal power, Tx signal power, Tx signal power relative to Rx signal power, and type of modulation used.

Figure 8A:
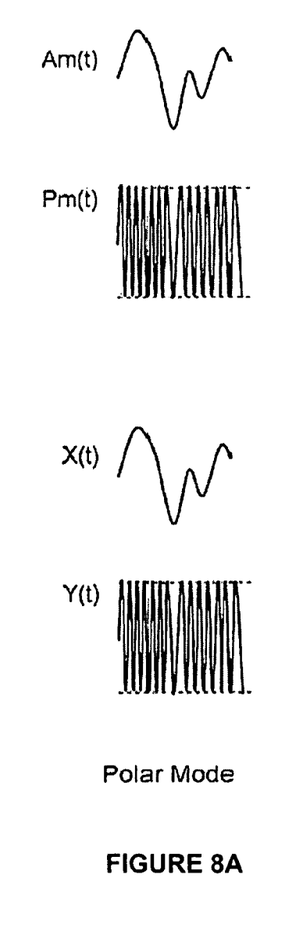
FIGS. 8A-C are diagrams of the amplitude and phase component signals Am(t) and Pm(t) and the first and second modulation signals X(t) and Y(t) generated by the signal decomposer in FIG. 7 for the three different operating modes (polar, quadrature and hybrid) the multi-mode transmitter of the transceiver in FIG. 6 is configurable to operate.

When the mode control command indicates that the multi-mode transmitter 602 is to operate in polar mode, the signal decomposer 612 distributes the full envelope information represented in the amplitude component signal Am(t) to the first modulation signal X(t) while the amplitude information represented in the second modulation signal Y(t) is held constant. The resulting first and second modulation signals X(t) and Y(t) in polar mode are shown in FIG. 8A.

Figure 8B:
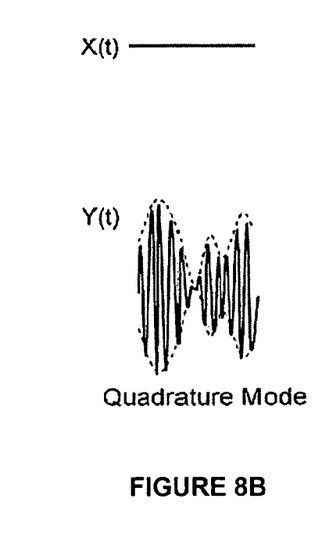

When the mode control command indicates that the multi-mode transmitter 602 is to operate in quadrature mode, the signal decomposer 612 distributes the envelope information represented in the amplitude component signal Am(t) into the second modulation signal Y(t) while the first modulation signal X(t) is held constant. The resulting first and second modulation signals X(t) and Y(t) in quadrature mode are shown in FIG. 8B.

Figure 8C:
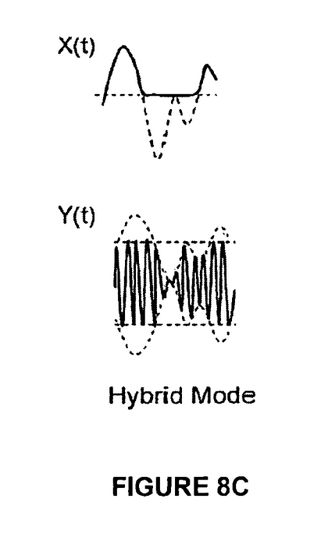

Finally, when the mode control command generated and provided by the operating mode controller 606 indicates that the multi-mode transmitter 602 is to operate in hybrid mode, the signal decomposer 612 performs an envelope-reduction and restoration (ERR) process. During the ERR process, amplitude information in the amplitude component signal Am(t) is distributed between the first and second modulation signals X(t) and Y(t), so that resulting amplitude modulated power supply signal Supply(t) and modulated RF carrier signal RFin(t) both have nonconstant envelopes. The resulting first and second modulation signals X(t) and Y(t) in hybrid mode are shown in FIG. 8C. Controlling the relative amplitude information represented in the first and second modulations signals X(t) and Y(t) using ERR has the desirable effect of reducing the signal bandwidths of the power supply signal Supply(t) and modulated RF signal RFin(t) applied to the power supply and RF input ports of the PA 618. Application of ERR also lowers the dynamic range of the first modulation signal X(t) compared to the dynamic range of the amplitude component signal Am(t), thereby beneficially easing the design requirements of the amplitude modulator 614.

The amplitude information represented in the Supply(t) and RFin(t) signals is restored at the output of the PA 618 in a manner that depends on which operating mode the multi-mode transmitter 602 is operating. When operating in quadrature mode, the PA 618 is biased in its linear region, the power supply signal Supply(t) applied to the power supply port of the PA 618 is held to a constant level, and the amplitude of the PA 618 output RFout(t) is determined by the amplitude of the modulated RF signal RFin(t) being applied to the RF input port of the PA 618. When configured for operation in polar mode, the PA 618 is configured to operate as a switch-mode amplifier (e.g., a Class D, E or F switch-mode amplifier) and the amplitude of RFout(t) is determined exclusively by the amplitude of the power supply signal Supply(t) supplied to the power supply port of the PA 618. Finally, when configured for operation in hybrid mode, the PA 618 is biased and operates in its saturation region and the amplitude of the PA 618 output RFout(t) is determined by the product of the amplitudes of the power supply signal Supply(t) and the modulated RF signal RFin(t).

Figure 9A:
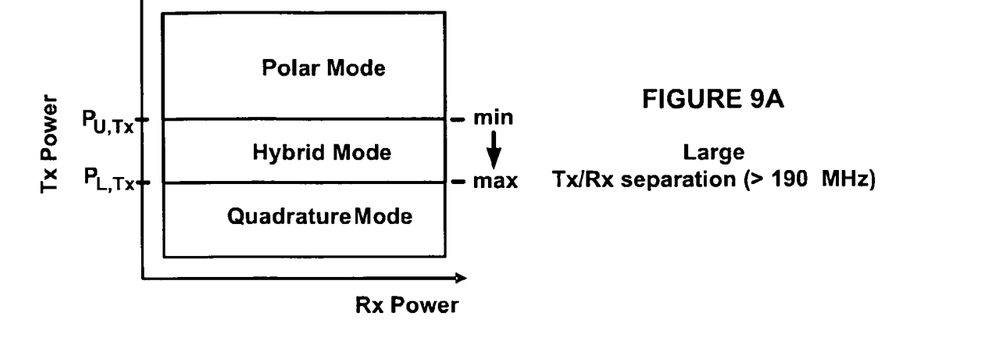
FIGS. 9A-C are operating mode maps illustrating how the three different operating modes (quadrature, hybrid and polar) of the multi-mode transmitter of the transceiver in FIG. 6 are mapped in relation to Tx and Rx powers for three different levels of Tx/Rx band separation.
Figure 9B:
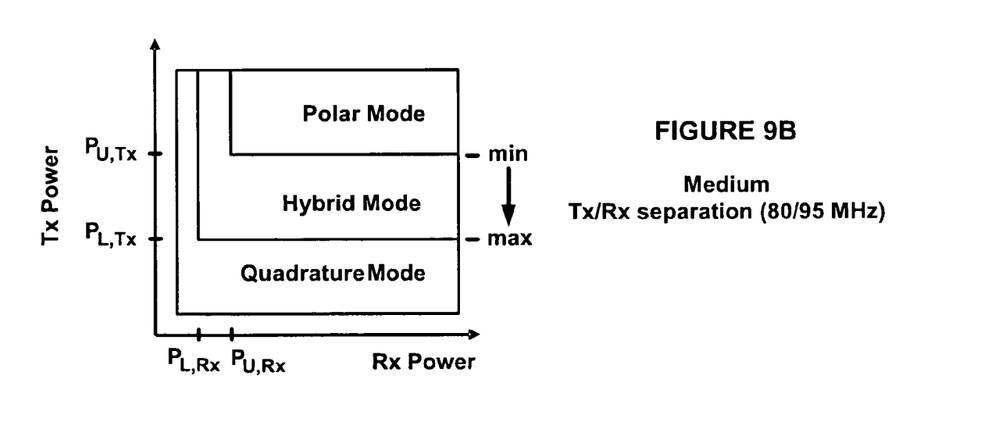
Figure 9C:
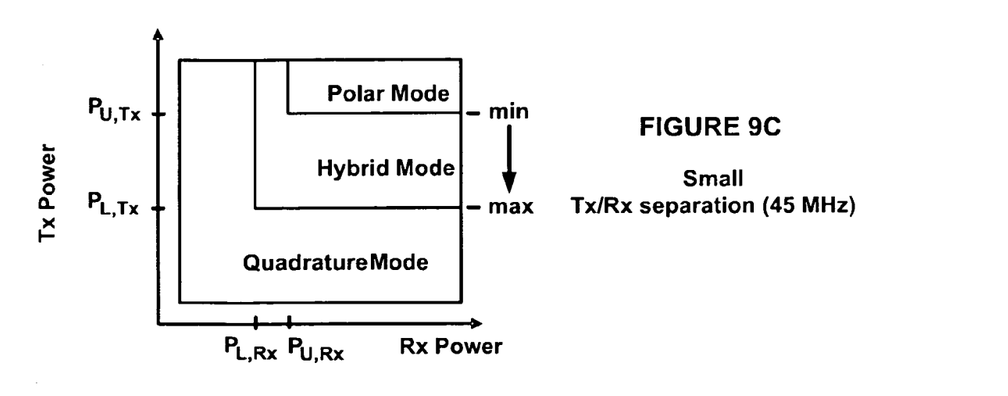
Figure 10A:
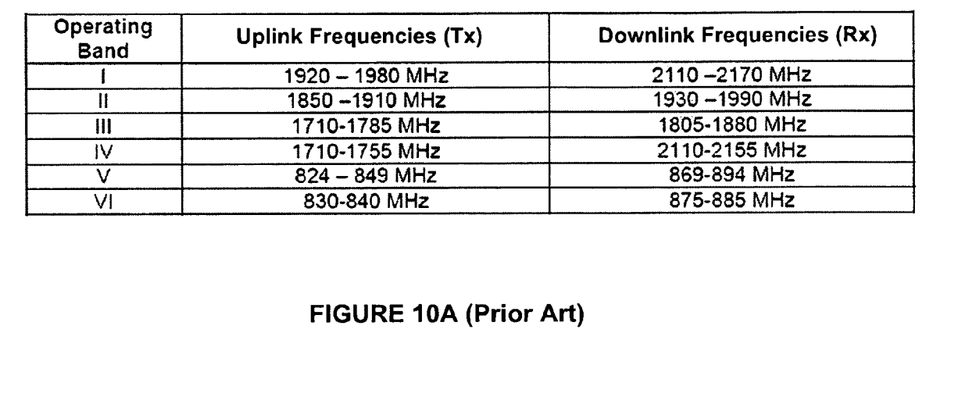
FIGS. 10A and 10B show the frequency ranges (FIG. 10A) of each of the uplink (i.e., Tx) and downlink (i.e., Rx) bands of various operating bands of the Universal Mobile Telecommunications System (UMTS) standard and the frequency separation (FIG. 10B) between the Tx and Rx bands for each of the various operating bands.
Figure 10B:
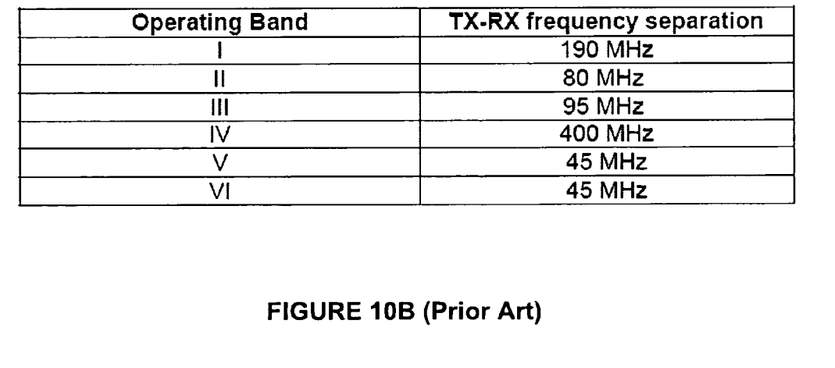

FIGS. 9A-C are operating mode maps illustrating how the three different operating modes (quadrature, hybrid and polar) are mapped in relation to Tx and Rx powers for three different levels of Tx/Rx band separation. For illustration purposes, the three different Tx/Rx band separation levels are shown to correspond to the uplink and downlink frequency separations of various of the operating bands of the Universal Mobile Telecommunications System (UMTS) standard, as shown in the tables in FIGS. 10A and 10B. These particular operating mode maps are merely exemplary, however, and operating mode maps for other Tx and Rx band separation levels and/or other standards can be formed, as will be appreciated by those of ordinary skill in the art. According to one embodiment, the operating mode information of the various operating mode maps are included in one or more look up tables (LUTs), which can be quickly accessed by the operating mode controller 606 during operation. The operating mode controller 606 adaptively accesses the appropriate LUT in response to a Tx/Rx Band Separation signal. From the selected LUT, the operating mode controller 606 then determines which operating mode is to be used, based on the Rx power, Tx power, Tx power relative to Rx power and/or type of modulation being used, and generates the appropriate mode control command accordingly.

FIG. 9A shows the operating mode map in the case of a large Tx/Rx band separation (e.g., greater than 190 MHz and corresponding to operating bands I and IV of the UMTS standard). With a large Tx/Rx band separation, the Tx and Rx bands are sufficiently separated that receive band noise caused by Tx leakage through the duplexer 608 is not a major issue and a one-dimensional mode mapping independent of Rx power is used. Accordingly, when the Tx power is higher than the upper Tx power level $P_{U,Tx}$, the operating mode controller 606 operates to generate a mode control command that causes the multi-mode transmitter 602 to operate in polar mode for all Rx powers. When configured for operation in polar mode the signal decomposer 612 of the multi-mode transmitter 602 responds to the mode control command by generating the first and second modulation signals X(t) and Y(t) as shown in FIG. 8A. When the Tx power is lower than the lower Tx power level $P_{L,Tx}$, the operating mode controller 606 operates to generate a mode control command that causes the multi-mode transmitter 602 to operate in quadrature mode. When configured for operation in quadrature mode the signal decomposer 612 of the multi-mode transmitter 602 responds to the mode control command by generating the first and second modulation signals X(t) and Y(t) as shown in FIG. 8B. Finally, when the Tx power falls between the lower and upper Tx power levels $P_{L,Tx}$ and $P_{U,Tx}$, the operating mode controller 606 operates to generate a mode control command that causes the multi-mode transmitter 602 to operate in hybrid mode. When configured for operation in hybrid mode the signal decomposer 612 of the multi-mode transmitter 602 responds to the mode control command by generating the first and second modulation signals X(t) and Y(t) as shown in FIG. 8C.

Operating the multi-mode transmitter 602 in hybrid or quadrature modes allows the signal decomposer 612 to generate a first modulation signal X(t) having a reduced dynamic range compared to the dynamic range of the amplitude component signal Am(t). The reduced dynamic range results in an amplitude modulated power supply signal Supply(t) also having a reduced dynamic range. Reducing the dynamic range of the amplitude modulated power supply signal Supply(t) avoids having to subject the PA 618 to low-amplitude supply voltages, which can be problematic in the conventional polar modulation transmitter 300 in FIG. 3.

As discussed above, when in hybrid mode the signal decomposer 612 performs an ERR process in which the amplitude information represented in the amplitude component signal Am(t) is distributed between the first and second modulation signals X(t) and Y(t) (see FIG. 8C). According to one embodiment, in performing the ERR process the amplitude information represented in the amplitude component signal Am(t) is distributed most entirely in the first modulation signal X(t) when the Tx power is near the boundary between the polar and hybrid mode regions of operation (i.e., near the upper Tx power level $P_{U,Tx}$), and is distributed most entirely in the second modulation signal Y(t) near the boundary between the hybrid and quadrature mode regions of operation (i.e., near the lower Tx power level $P_{L,Tx}$). For Tx power levels from the polar mode/hybrid mode boundary to the hybrid mode/quadrature mode boundary, the signal decomposer 612 operates to gradually distribute more of the amplitude information into the second modulation signal Y(t) and less into the first modulation signal X(t). This aspect of the invention is indicated by the "min" and "max" labels in the operating mode maps in FIGS. 9A-C.

FIG. 9B is an operating mode map in the case of a medium Tx/Rx band separation (e.g., 80 or 95 MHz and corresponding to operating bands II and II of the UMTS standard). In this case, the Tx and Rx bands are close enough in frequency that receive band noise attributable to Tx leakage through the duplexer 608 may be high enough that desensitization of the receiver 604 can be of concern. Because out-of-band Tx signal energy is more severe in polar mode (e.g., due to bandwidth expansion), and desensitization is more likely to occur at low Rx powers, polar mode is used only for Rx powers greater than an upper Rx power level $P_{U,Rx}$. For Rx powers less than a lower Rx power level $P_{L,Rx}$, the multi-mode transmitter 602 is allowed to operate only in quadrature mode, to avoid desensitizing the receiver 604. Quadrature mode is also commanded for Tx powers less than the lower Tx power level $P_{L,Tx}$, irrespective of the Rx power, to further avoid desensitization of the receiver 604 and to avoid having to subject the amplitude modulator 614 to low-amplitude signals. When the Tx power is higher than the upper Tx power level $P_{U,Tx}$ and the Rx power is between the lower and upper Rx power levels $P_{L,Rx}$ and $P_{U,Rx}$, the operating mode controller 606 commands the multi-mode transmitter 604 to operate in hybrid mode. Hybrid mode is also commanded for Tx powers between the lower and upper Tx power levels $P_{L,Tx}$ and $P_{U,Tx}$, so long as the Rx power is above the lower Rx power level $P_{L,Rx}$. In hybrid mode, a balance between enhancing power efficiency and avoiding the generation of receive band noise is achieved using the ERR process described above. Finally, polar mode is made available when the Tx power is higher than the upper Tx power levels $P_{U,Tx}$ and the Rx power is greater than the upper Rx power level $P_{U,Rx}$, thereby maximizing efficiency of the multi-mode transmitter 602.

FIG. 9C is an operating mode map in the case of a small Tx/Rx band separation (e.g., 45 MHz or less and corresponding to operating bands V and VI of the UMTS standard). In this case, the Tx and Rx bands are close enough in frequency that receive band noise attributable to Tx leakage through the duplexer 608 to the receiver 604 is a potentially serious problem. Accordingly, to limit receive band noise, the upper Tx and Rx power levels $P_{U,Tx}$ and $P_{U,Rx}$ are both increased so that polar mode is used only when the Rx power level is high and the Tx power is significantly higher than the Rx power level. Either quadrature mode or hybrid mode is used if the Rx power is lower than the upper Rx power level $P_{U,Rx}$ or the Tx power is lower than the upper Tx power level $P_{U,Tx}$. The lower Rx power level $P_{L,Rx}$ and lower Tx power level $P_{L,Tx}$ are also increased compared to the lower Rx and Tx power levels in the mode maps in FIGS. 9A and 9B, since the Tx and Rx bands are closely spaced and desensitization of the receiver 604 is more of a concern.

Although the present invention has been described with reference to specific embodiments, these embodiments are merely illustrative and not restrictive of the present invention. Further, various modifications or changes to the specifically disclosed exemplary embodiments will be suggested to persons skilled in the art and are to be included within the spirit and purview of this application and scope of the appended claims.

What is claimed is:

1. A transceiver apparatus, comprising:
  a transmitter configurable to operate in a plurality of operating modes;
  a receiver; and
  an operating mode controller configured to receive an indication of a transmit power said transmitter is to transmit and control which operating mode of said plurality of operating modes said transmitter is to operate based on a level of frequency separation between a transmit frequency band and a receive frequency band.

2. The transceiver apparatus of claim 1 wherein said operating mode controller is further configured to control which operating mode said transmitter is to operate based on said transmit power.

3. The transceiver apparatus of claim 1 wherein said operating mode controller is further configured to control which operating mode said transmitter is to operate based on a receive power of said receiver.

4. A transceiver apparatus, comprising:
  a transmitter configurable to operate in a plurality of operating modes;
  a receiver;
  a plurality of look up tables (LUTs); and
  an operating mode controller configured to receive an indication of a transmit power said transmitter is to transmit and control which operating mode of said plurality of operating modes said transmitter is to operate,
  wherein said transmitter is configurable to transmit in a plurality of transmit frequency bands, said receiver is configurable to receive in a plurality of receive frequency bands, and said operating mode controller is configured to control which operating mode of said plurality of operating modes said transmitter is to transmit depending on which transmit frequency band of said plurality of transmit frequency bands said transmitter is configured to transmit and which receive frequency band of said plurality of receive frequency bands said receiver is configured to receive,
  wherein said LUTs are configured to correspond to a plurality of transmit frequency band and receive frequency band pairs, wherein said plurality of operating modes is mapped into each of said LUTs in relation to receive powers of said receiver and transmit powers of said transmitter and in a manner dependent upon levels of frequency separation between each of the transmit frequency band and receive frequency band pairs, and
  wherein said operating mode controller is configured to access a LUT from among said plurality of LUTs depending on which transmit frequency band of said plurality of transmit frequency bands said transmitter is configured to transmit and which receive band of said plurality of receive bands said receiver is configured to receive.

5. A method of transmitting communications signals, comprising:
  determining a level of frequency separation between a transmit frequency band of a transmitter and a receive frequency band of a receiver; and
  configuring said transmitter to transmit according to one of a plurality of different operating modes the transmitter is configurable to transmit based on the level of frequency separation between said transmit frequency band and said receive frequency band.

6. The method of claim 5 wherein said plurality of different operating modes includes a polar mode, a quadrature mode and a hybrid mode.

7. The method of claim 5 wherein configuring said transmitter to transmit according to one of a plurality of different operating modes is further based on a transmit power said transmitter is to transmit.

8. The method of claim 5 wherein configuring said transmitter to transmit according to one of a plurality of different operating modes is further based on a receive power of signals received by said receiver.

9. The method of claim 5 wherein configuring said transmitter to transmit according to one of a plurality of different operating modes is further based on a transmit power said transmitter is to transmit relative to a receive power of signals received by said receiver.

10. The method of claim 5 wherein configuring said transmitter to transmit according to one of a plurality of different operating modes is further based on a type of modulation used by said transmitter.

11. A method of transmitting communications signals, comprising:

determining a transmit power at which a transmitter is to transmit and a receive power of a signal received by a receiver; and configuring said transmitter to transmit according to one of a plurality of different operating modes the transmitter is configurable to transmit depending on said transmit power and a level of frequency separation between a transmit frequency band and a receive frequency band.

* * * * *